United States Patent [19]

Chin

[11] 4,450,463
[45] May 22, 1984

[54] MULTIPLE-QUANTUM-LAYER PHOTODETECTOR

[75] Inventor: Raymond Chin, Thousand Oaks, Calif.

[73] Assignee: Rockwell International Corporation, El Segundo, Calif.

[21] Appl. No.: 278,804

[22] Filed: Jun. 29, 1981

[51] Int. Cl.³ .......................................... H01L 27/14
[52] U.S. Cl. ...................................... 357/30; 357/16; 357/4
[58] Field of Search ............................... 357/4, 16, 30

[56] References Cited

U.S. PATENT DOCUMENTS

| | | | |
|---|---|---|---|
| 4,194,935 | 3/1980 | Dingle | 148/175 |
| 4,208,667 | 6/1980 | Chang | 357/16 |
| 4,250,515 | 2/1981 | Esaki | 357/16 |
| 4,257,055 | 3/1981 | Hess | 357/16 |
| 4,348,686 | 9/1982 | Esaki | 357/30 |

OTHER PUBLICATIONS

Esaki, et al., Superlattice and Negative Differential Conductivity in Semiconductors, IBM J. Res. Develop., p. 61 (Jan., 1970).

*Primary Examiner*—Martin H. Edlow
*Attorney, Agent, or Firm*—H. Fredrick Hamann; Craig O. Malin; John J. Deinken

[57] ABSTRACT

Disclosed is a multiple-quantum-layer detector for responding to photons having a predetermined amount of energy. The detector includes a purality of parallel layers of a first semiconducting material having a first conduction band energy level, with a plurality of layers of a second semiconducting material parallel to the first layers and having a second conduction band energy level differing from the first conduction band energy level by no more than the predetermined energy. The second layers alternate with the first to establish a plurality of parallel heterojunctions. First and second electrodes are provided for applying an electric potential across the alternating layers.

4 Claims, 2 Drawing Figures

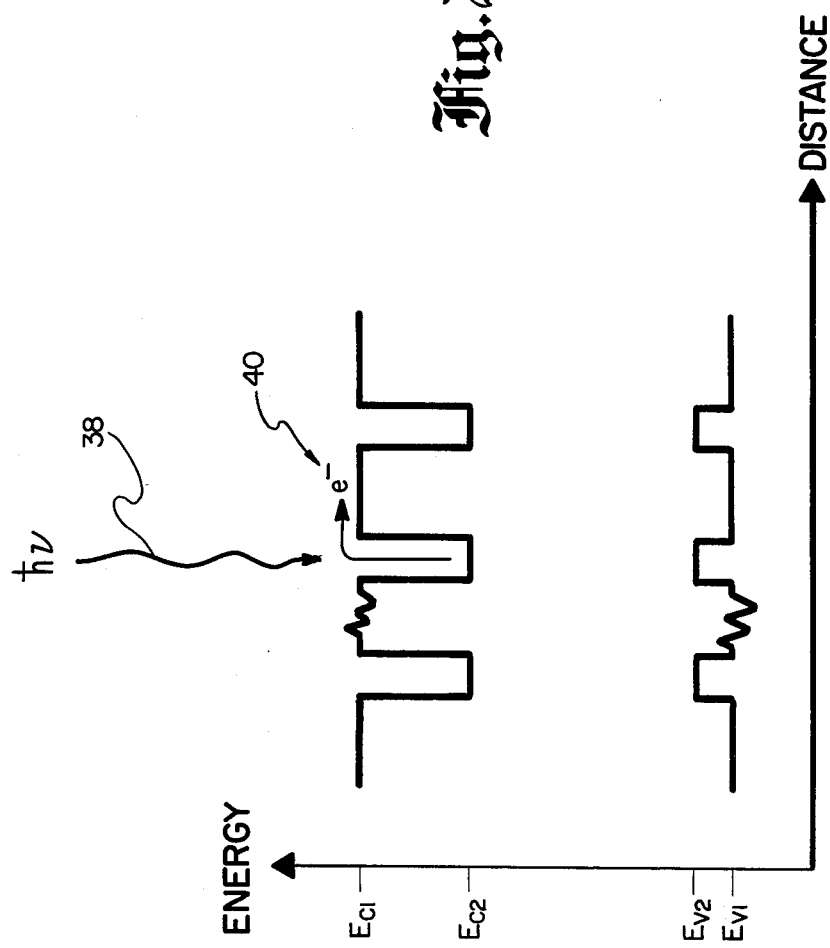

MULTIPLE-QUANTUM-LAYER PHOTODETECTOR

BACKGROUND OF THE INVENTION

This invention relates to solid state photodetector devices.

Photoconductivity is the name given to the increase in electrical conductivity which occurs in a nonmetallic solid when it is exposed to electromagnetic radiation. This increase in conductivity occurs as a result of the additional free charge carriers (electrons or holes) which are generated when photons are absorbed in electronic transitions. The rate at which the free carriers are generated and the length of time they persist in a conducting state determines the amount of the change in conductivity.

In order to be absorbed, a photon must have a quantized energy which is equivalent to or greater than the energy bandgap which is characteristic of the absorbing material. This effect has been used to advantage to construct photodetector which are sensitive to particular frequencies of light. In a semiconductor, for example, a photon may be absorbed if it has an energy corresponding to the bandgap between the valence band and the conduction band of the semiconductor. Thus a photodetector sensitive to light of a particular frequency may be achieved by applying an electric field across a semiconductor material having the appropriate bandgap. When light of the predetermined frequency is directed onto the semiconductor, photons are absorbed, thereby creating electron-hole pairs which contribute to the conduction process. The extent of the resulting change in the conductivity of the material will indicate the amount of light which is present.

Unfortunately, however, the spectral range of light which can be detected by semiconductor detectors has heretofore been limited because of the quantized values of the energy bandgaps between the valence and the conduction bands is such materials. Semiconductor compounds formed by combinations of elements from columns III and V of the periodic table, for example, have been utilized in such detector configurations, but such III-V detectors with $E_g \geq 0.62$ eV are not responsive to light with wavelengths greater than 2 $\mu$m. It would be very advantageous to provide a detector structure utilizing semiconductor materials which can be adjusted to detect light in a particular wavelength region, rather than having to select materials with an appropriate bandgap but with undeveloped or uncertain processing technology.

SUMMARY OF THE INVENTION

It is a general objective of this invention to provide a new and improved photodetector.

In one embodiment, the multiple-quantum-layer photodetector of this invention, which is responsive to photons having a predetermined amount of energy, includes a plurality of layers of a first semiconducting material having a first conduction band energy level and a plurality of layers of a second semiconducting material having a second conduction band energy level which differs from the first conduction band energy level by no more than the predetermined amount of energy. The second layers are arranged to alternate with the first layers to establish a heterojunction between each two layers. The number of the second type of layers in the detector may be increased to provide a desired amount of sensitivity in the response of the detector.

In a more particular embodiment, first and second electrodes are included for applying an electric potential across the alternating layer structure, with the layers of the second type kept sufficiently thin to prevent the recapture of electrons photoexcited from those layers, while the first layers are sufficiently thick to accelerate the photoexcited electrons under the influence of the electric potential.

In a side illuminated embodiment, the alternating layers define a side perpendicular to the heterojunctions which is adapted for receiving the incident photons. The electric potential is applied in a direction perpendicular to the heterojunctions.

A method of making a multiple-quantum-layer detector, according to this invention, begins with a semiconducting substrate. A lattice matching semiconducting buffer layer is deposited on the substrate, and an epitaxial layer of a first semiconducting material having a first conduction band energy level and a first thickness is grown on the buffer layer. An epitaxial layer of a second semiconducting material having a second conduction band energy level and a second thickness is then grown on the first epitaxial layer. Additional layers of the first and second materials are grown to achieve an alternating layer structure with a plurality of heterojunctions between the layers.

The method may further include depositing a first ohmic contact on the substrate opposite the buffer layer, depositing a semiconducting isolation layer on the last layer grown in the alternating layer structure and depositing a second ohmic contact on the isolation layer.

These examples summarize some of the more important features of this invention, in order to facilitate an understanding of the detailed description which follows and so that the contributions which the invention provides to the art may be better appreciated. There are, of course, additional features of the invention, which will be further described below and which are included within the subject matter of the appended claims.

BRIEF DESCRIPTION OF THE DRAWINGS

Additional objective, features, and advantages of the present invention will be evident from the description below of the preferred embodiments and the accompanying drawings, wherein the same numerals are used to refer to like elements throughout all the figures. In the drawings:

FIG. 2 is an energy bandgap diagram for the photodetector of FIG. 1.

DESCRIPTION OF THE PREFERRED EMBODIMENTS

Figure 1:
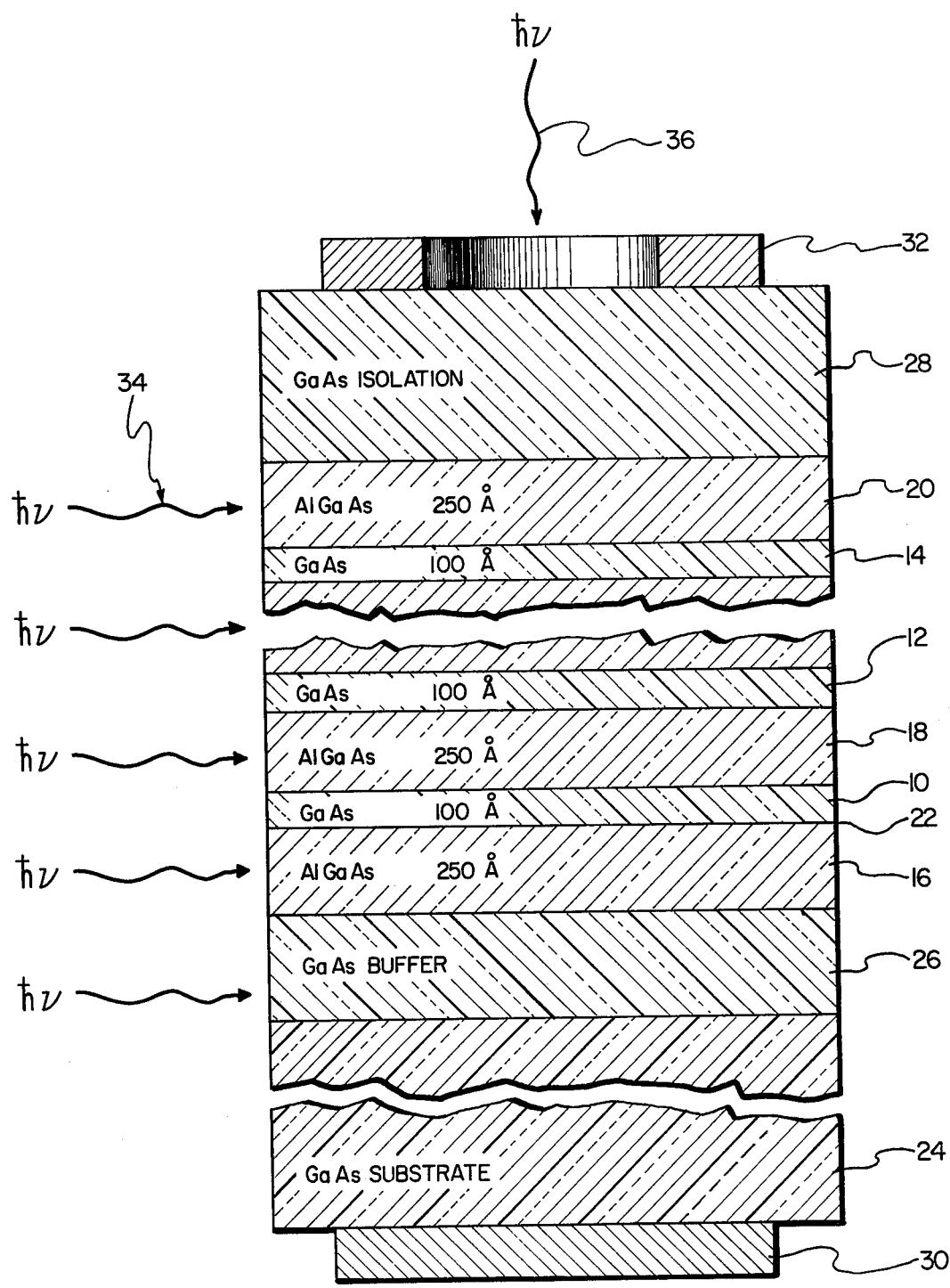
FIG. 1 is a cross-sectional side view illustrating a photodetector constructed according to the invention.

One preferred embodiment of the photodetector constructed according to the present invention is illustrated in a sectional side view in FIG. 1. The embodiment is fabricated with III-V semiconductor compounds, the present invention making it feasible to achieve sensitivity to long wavelength ($\lambda > 2$ $\mu$m) light using III-V materials. It should be appreciated, however, that the invention is not limited to this group of materials. Those skilled in the art should be able to readily apply the teachings of the invention to photodetectors utilizing other semiconducting materials. The photodetector includes a first series of layers 10, 12 and 14 which are fabricated from a first III-V semiconductor compound having a first conduction band energy level. A second series of layers, including the layers 16, 18 and 20 alternates with the layers of the first series to establish a plurality of heterojunctions, such as the heterojunction 22, the second series layers being made of a second III-V semiconductor compound having a second conduction band energy level. The difference between the second conduction band energy level and the energy level of the conduction band in the first layers is less than or equal to the amount of energy of photons at the wavelength of light which is to be detected.

As those skilled in the art will appreciate, the thicknesses of the various layers illustrated are exaggerated relative to the other dimensions of the drawing for the purpose of clarity. Furthermore, the illustration includes a break in the series of layers to indicate that an actual device would typically contain a greater number of layers than can be conveniently depicted here.

In the preferred embodiment, the photodetector is constructed by beginning with an n-type GaAs substrate 24. A buffer layer 26 of n-type GaAs doped with Se to a concentration of approximately $10^{18}$ cm$^{-3}$ is deposited on the substrate to isolate the lattice defects in the substrate and promote the crystalline quality of the alternating layers. Next, an $Al_{0.3}Ga_{0.7}As$ layer 16 is epitaxially grown on the buffer layer. This layer, which is undoped, is grown to a thickness of approximately 250 Å. On top of the layer 16, a layer 10 of GaAs, doped with Se to a concentration of approximately $10^{19}$ cm$^{-3}$, is epitaxially grown to a thickness of approximately 100 Å, forming the heterojunction 22 between the two layers. The epitaxial growth of layers similar to layers 10 and 16 is repeated to build up an alternating layer structure with, in the preferred embodiment, a total of 251 layers, ending with a layer 20 of $Al_{0.3}Ga_{0.7}As$. An isolation layer 28 of GaAs, which is Se doped to a concentration of approximately $10^{19}$ cm$^{-3}$, is deposited on the layer 20 to a thickness of approximately 500 Å. Finally, a first ohmic contact 30 is deposited on the substrate 24 and a second ohmic contact 32 is deposited on the isolation layer 28 in the shape of the ring to allow the passage of photons therethrough.

In operation, an electric potential is applied across the detector by means of the electrodes 30 and 32. The device is oriented so that the light which is to be detected may impinge on a side of the device, as indicated by the photons 34, or through the top of the detector, as with the photon 36. The conductivity of the device will be affected by the amount of light at the predetermined wavelength which is absorbed in the layers, so that appropriate processing circuitry connected to the electrodes 30 and 32 can be utilized to detect the light. The processing circuitry which is required with the detector of this invention is known in the art and need not be discussed in any further detail.

The mechanism by which photons of the appropriate wavelength are made to affect the conductivity of this photodetector is an outstanding feature of the invention. In a conventional photodetector, when the photon energy of incident light is at least equal to the forbidden energy gap, i.e., $$hc/\lambda \geq E_g$$

(where h is Planck's constant, c is the speed of light, $\lambda$ is the wave-length of the incident photon, and $E_g$ is the amount of transition energy from the valence band to the conduction band), electrons may be excited from the filled valence band to the conduction band. This intrinsic absorption transition will produce an electron-hole pair, with an electron in the conduction band and a hole in the valence band. Free carriers may also be produced at lower photon energies when there are impurities or other crystal defects present which could give rise to an energy state in the forbidden gap. Such a state would be at an energy $E_c - E$ below the conduction band and $E - E_v$ above the valence band. Depending upon whether this state is occupied by an electron, a photon of the appropriate energy may produce a transition from that state to the conduction band or from the valence band to the impurity state. The former transition produces a free electron, while the latter yields a free hole.

The wavelengths of light for which this mechanism can be utilized, however, are limited by the relationship between those wavelengths and the energy gaps which exist in the material of which the photodetector is constructed. Certain III-V semiconductor compounds, for example, do not exhibit energy bandgaps appropriate for the detection of light at wavelengths longer than 2 $\mu$m. The present invention, however, makes it possible to utilize such III-V materials in a photodetector which is sensitive to light at such wavelengths.

FIG. 2 is an energy level diagram for the photodetector structure of FIG. 1. In FIG. 2, $E_{c1}$ represents the energy level of the conduction band for the larger bandgap layers 16 and 20, while $E_{c2}$ is the energy level of the conduction band in the layers 10, 12 and 14. $E_{v1}$ is the energy level of the valence band in the layers 16–20 and $E_{v2}$ is the energy level of the valence band in the layers 10–14.

When a photon 38 having the necessary energy enters a narrow bandgap layer, the photon will be absorbed and will excite an electron 40 into the wider gap material if a sufficient electric field is applied across the detector and if the energy of the photon is equal to or greater than the difference between the energy levels of the conduction bands in the first and second compounds. In the preferred embodiment of FIG. 1, for example, photons having energies of at least 300 meV will be absorbed in the GaAs layers. Thus, if the wider gap layers 16–20 are sufficiently thick to accelerate such an excited electron, and if the narrow gap layers 10–14 are sufficiently thin to prevent the capture of such an excited electron therein, these electrons can enable the detector to respond to such photons if a sufficient number of lower gap layers, such as layers 10–14, are provided to ensure an adequate amount of sensitivity in the detector. The electrons act, in effect, as electrons of ionized impurities leading to extrinsic photoconduction. Because the heterobarrier $E_{c1} - E_{c2}$ acts as the bandgap for this mechanism, it is possible to select appropriate III-V materials (with $E_g$ greater than 0.62 eV) to provide detection in the long wavelength area of the spectrum ($\lambda > 2$ $\mu$m). In addition, the composition of the first and second semiconductor compounds can be varied to tune the detector to the desired wavelength.

Although a typical embodiment of the present invention has been illustrated and discussed above, modifications and additional embodiments of the invention will undoubtedly be apparent to those skilled in the art. Various changes, for example, may be made in the configurations, sizes, and arrangement of the components of the invention without departing from the scope of the invention. It may also be desirable to design such a detector with avalanche gain. Furthermore, equivalent elements may be substituted for those illustrated and described herein, parts or connections might be reversed or otherwise interchanged, and certain features of the invention might be utilized independently of the use of other features. Consequently, the examples presented herein, which are provided to reach those skilled in the art how to construct the apparatus and perform the method of this invention, should be considered as illustrative only and not all inclusive, the appended claims being more indicative of the full scope of the invention.

What is claimed is:

1. A multiple-quantum-layer detector for responding to photons having a predetermined amount of energy, comprising:
   a plurality of layers of a first semiconducting material having a first conduction band energy level; and
   a plurality of layers of a second semiconducting material having a second conduction band energy level differing from said first conduction band energy level by no more than said predetermined energy,
   said second layers alternating with said first layers to establish therebetween a plurality of heterojunctions,
   said second layers being sufficiently thin to prevent the recapture of electrons photoexcited from said second layers, said first layers being sufficiently thick to accelerate said photoexcited electrons under the influence of said electric potential.

2. The detector of claim 1, further comprising first and second electrodes for applying an electric potential across said alternating layers.

3. A multiple-quantum-layer detector for responding to photons having a predetermined amount of energy, comprising:
   a plurality of layers of a first semiconductor material having a first conduction band energy level;
   a plurality of layers of a second semiconductor material having a second conduction band energy level differing from said first conduction band energy level by no more than said predetermined energy, said second layers alternating with said first layers to establish therebetween a plurality of heterojunctions; and
   first and second electrodes for applying an electric potential across said alternating layers,
   said second layers being sufficiently thin to prevent the recapture of electrons photoexcited from said second layers, while said first layers are sufficiently thick to accelerate said photoexcited electrons under the influence of said electric potential.

4. The detector of claim 3, wherein said electric potential is applied in a direction perpendicular to said heterojunctions and said photons are directed parallel to said heterojunctions.

* * * * *